United States Patent
Kondo et al.

(10) Patent No.: US 7,535,384 B2
(45) Date of Patent: May 19, 2009

(54) ENCODING APPARATUS, DECODING APPARATUS, ENCODING METHOD, DECODING METHOD, AND INFORMATION RECORDING AND PLAYBACK APPARATUS

(75) Inventors: Yosuke Kondo, Ome (JP); Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/819,392

(22) Filed: Jun. 27, 2007

(65) Prior Publication Data

US 2008/0001792 A1  Jan. 3, 2008

(30) Foreign Application Priority Data

Jun. 29, 2006  (JP)  ............... 2006-179906

(51) Int. Cl.
*H03M 7/00* (2006.01)
(52) U.S. Cl. .............. 341/59; 341/58; 375/316
(58) Field of Classification Search ........... 341/58, 341/59; 375/316; 370/208
See application file for complete search history.

(56) References Cited

U.S. PATENT DOCUMENTS 6,104,324 A * 8/2000 Kim ............... 341/58

2004/0139381 A1 * 7/2004 Inokuchi et al. ........... 714/758
2004/0177308 A1   9/2004 Kim et al.
2004/0196927 A1 * 10/2004 Jin et al. .............. 375/316
2006/0126492 A1 * 6/2006 Hyun et al. ............ 370/208

FOREIGN PATENT DOCUMENTS

JP  2005-78687   3/2002
JP  2005-191779  7/2005

* cited by examiner

*Primary Examiner*—Jean B Jeanglaude
(74) *Attorney, Agent, or Firm*—Pillsbury Winthrop Shaw Pittman, LLP

(57) ABSTRACT

There is provided an apparatus which obtains a circumstance where LDPC codes are interleaved without damaging modulation rules and thereby a correction ability of LDPC encoding and decoding method is fully exhibited. The apparatus includes an RLL rule applying section which modulates user data by applying an RLL rule to the user data and thereby obtains RLL encoded sequence data, an interleave section which interleaves the RLL encoded sequence data and thereby obtains interleaved sequence data, an LDPC parity generating section which subjects the interleaved sequence data to LDPC encoding processing and thereby obtains LDPC parity sequence data, an inserting section which inserts parity of the LDPC parity sequence data in the RLL encoded sequence data in a distribution manner and thereby obtains output data, and an output section which records or transmits the output data.

13 Claims, 3 Drawing Sheets

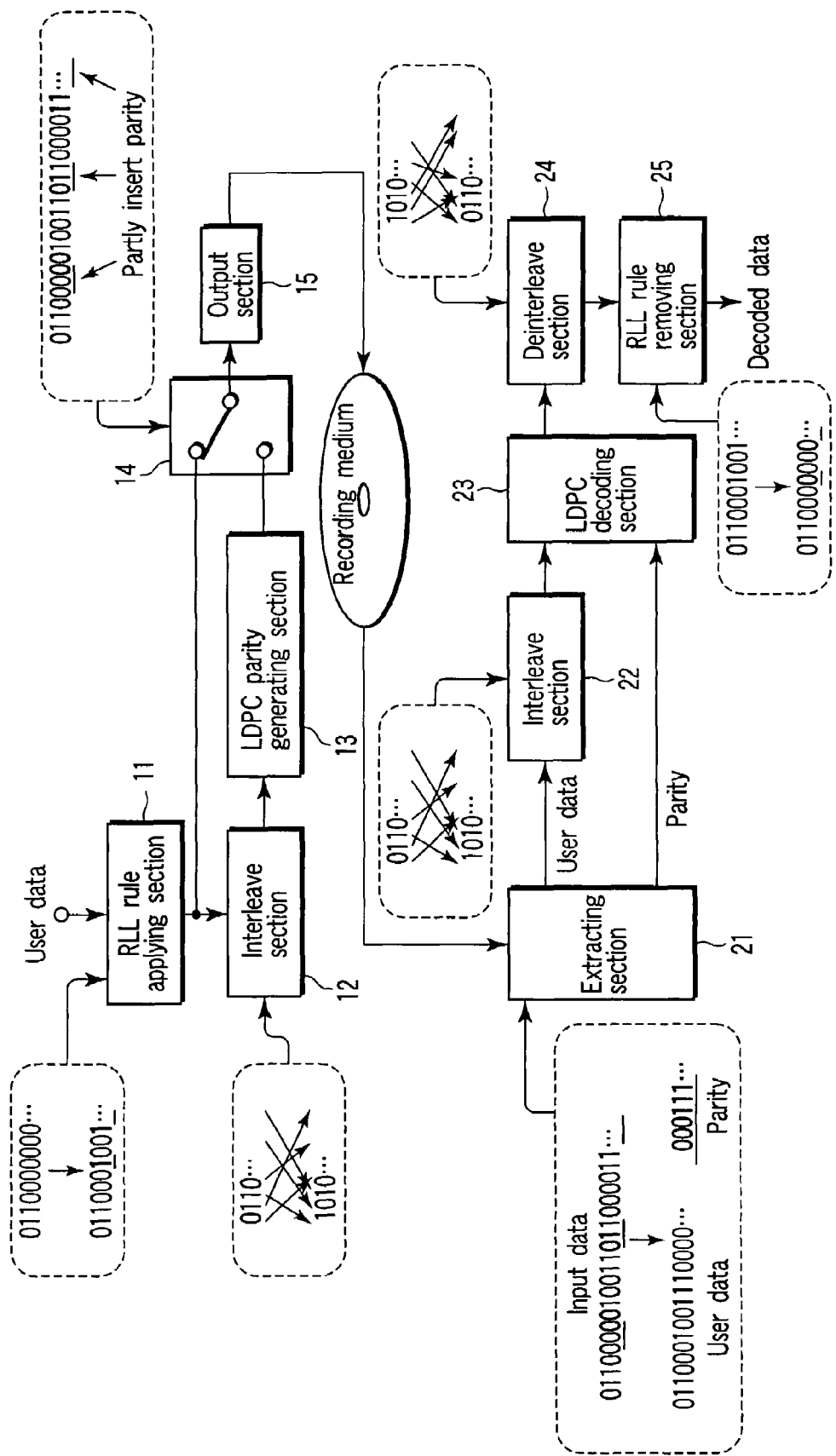
F I G. 1

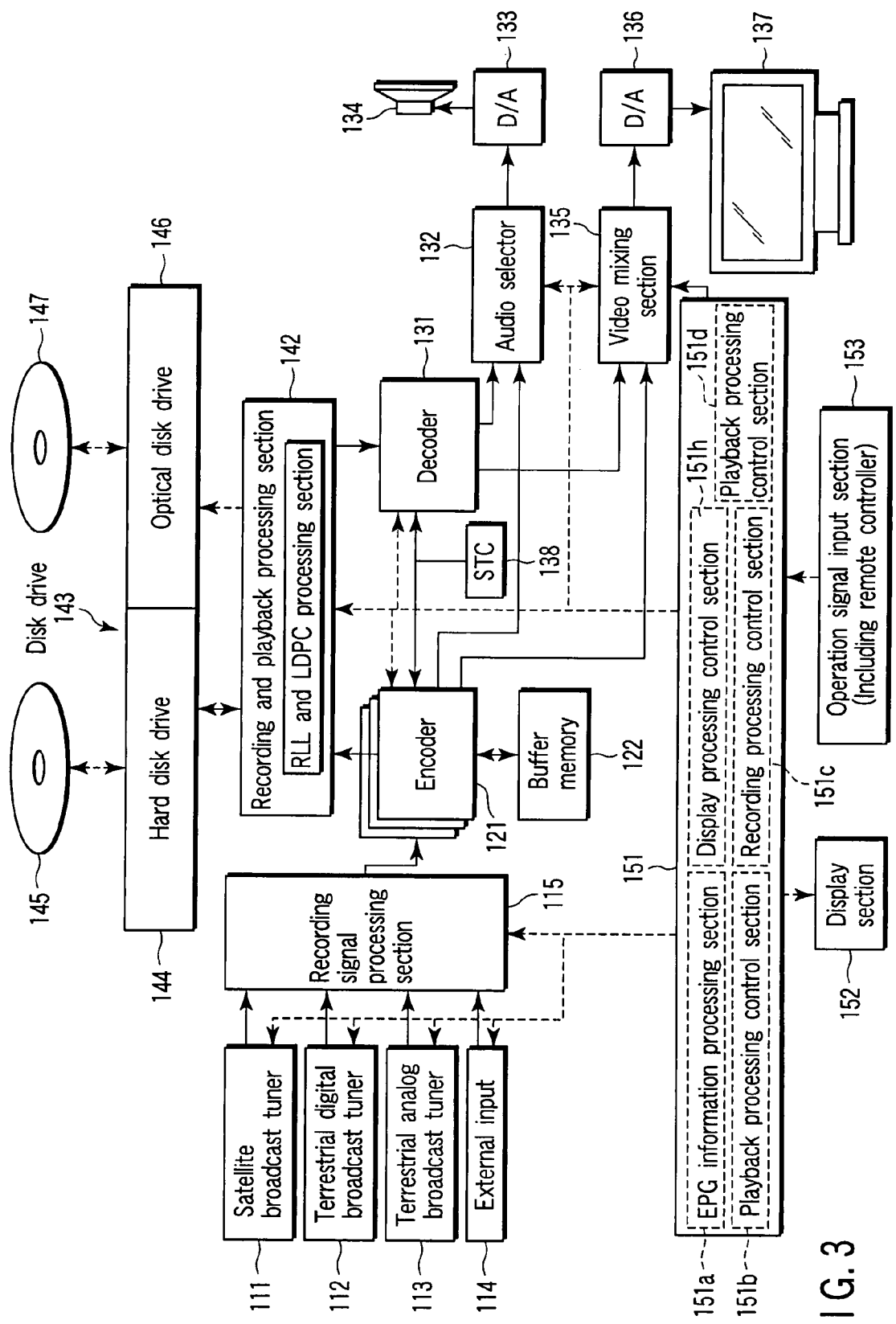
F I G. 3

ENCODING APPARATUS, DECODING APPARATUS, ENCODING METHOD, DECODING METHOD, AND INFORMATION RECORDING AND PLAYBACK APPARATUS

CROSS-REFERENCE TO RELATED APPLICATIONS

This application is based upon and claims the benefit of priority from Japanese Patent Application No. 2006-179906, filed Jun. 29, 2006, the entire contents of which are incorporated herein by reference.

BACKGROUND

1. Field

One embodiment of the invention relates to an encoding apparatus, a decoding apparatus, an encoding method, a decoding method, and an information recording and playback apparatus.

The present invention relates to an apparatus, method, an information recording and playback apparatus, and a recording medium of the same, which apply a modulation rule suitable for a recording medium to information to be recorded (user data), and adopt low-density parity check (LDPC) encoding and decoding method. For example, in magnetic recording, generally known modulation methods suitable for recording media are RLL encoding which limits the number of successive "0", and MTR (Maximum Transition Run) encoding which limits the number of reversals of magnetization. The present invention is applicable to a recording and playback system adopting a modulation method such as RLL encoding and MTR encoding.

2. Description of the Related Art

Jpn. Pat. Appln. KOKAI Pub. No. 2005-78687 discloses a technique obtained by combining a technique of encoding a data word of m bits into an information word of n bits satisfying RLL rules, with a technique of LDPC encoding and decoding method. In the technique, check bit information of LDPC code is inserted into an information word string, and digital sum value (DSV) control is performed.

When information encoded by LDPC encoding and decoding method is decoded, correction and decoding are performed on the supposition that each bit is independent. Therefore, LDPC encoding and decoding method has a high correction ability for random errors and discrete errors. However, LDPC encoding and decoding method has a problem of having a weak correction ability for continuous errors. Such continuous errors occur in reproduced signals due to dust or scratches on a part of a recording medium.

To cover the weakness of LDPC encoding and decoding method, it is one choice to interleave LDPC codes when signals are recorded on a recording medium. The recorded interleaved signals are deinterleaved when they are played back. Therefore, continuous error parts are dispersed by deinterleave and changed into random errors, and thereby the correction ability of LDPC encoding and decoding method can be sufficiently exhibited. However, performing interleave causes the following new problem.

Specifically, when information is recorded on a recording medium, for example, RLL rule processing is performed for user data as modulation rule applying processing, and then LDPC encoding is performed for the processed data. Then, interleave processing is performed to compensate the weakness of LDPC encoding and decoding method.

The problem of the above process is that the RLL rule which has been applied to the data is damaged by the interleave processing. To avoid the above problem, the encoding order "LDPC encoding→interleave→RLL encoding" can be adopted. Adopting the above order enables obtaining of a transmission sequence without damaging the RLL rules.

However, there is a significant reason why LDPC encoding must be performed after RLL encoding. Specifically, in RLL codes and MTR codes, the value of input and output sequences is "0" or "1". However, in "repeated decoding" used for LDPC codes and turbo codes, an input of a decoder is not a hard value such as "0" or "1", but a probability value (soft value) representing the likelihood that the value is "0" or "1". Therefore, also in PRML method, SOVA (Soft Output Viterbi Algorithm) which outputs a soft determination value and Max-Log-Map algorithm are used instead of a conventional Viterbi decoder which outputs a hard determination value as a maximum likelihood sequence. Therefore, sequences encoded in the order "LDPC encoding→interleave→RLL encoding" have to be decoded in the order "RLL encoding→deinterleave→LDPC encoding". However, in this case, an input to the RLL decoder is a soft determination value, and thus it is difficult to perform RLL decoding. Further, if RLL decoding can be performed for the soft determination information, it is highly possible that the determination information includes many errors, and thus the performance of LDPC decoding is not fully exhibited.

BRIEF SUMMARY OF THE INVENTION

An object of the embodiments of the present invention is to provide encoding decoding apparatuses, encoding and decoding methods, and a recording medium which obtains a circumstance where a correction ability of LDPC encoding and decoding method is fully exhibited, by interleaving LDPC codes while maintaining the order of "RLL encoding→LDPC encoding", and without damaging the modulation rules.

According to one aspect of the present invention, there is basically provided an apparatus comprising:

a modulation rule applying section which modulates user data into a data code sequence formed of logic 1 and logic 0 according to a predetermined rule, and thereby obtains modulation-rule-applied encoded sequence data;

an interleave section which interleaves the modulation-rule-applied encoded sequence data, and thereby obtains interleaved sequence data;

an LDPC parity generating section which subjects the interleaved sequence data to low density parity check (LDPC) encoding processing, and thereby obtains LDPC parity sequence data;

an inserting section which inserts parity of the LDPC parity sequence data in the modulation-rule-applied encoded sequence data in a distribution manner, and thereby obtains output data; and an output section which transmits the output data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 1 is a diagram illustrating a basic configuration of an apparatus of the present invention.

FIG. 3 is a block diagram of an information recording and playback apparatus to which the present invention is applied.

DETAILED DESCRIPTION

Figure 2:
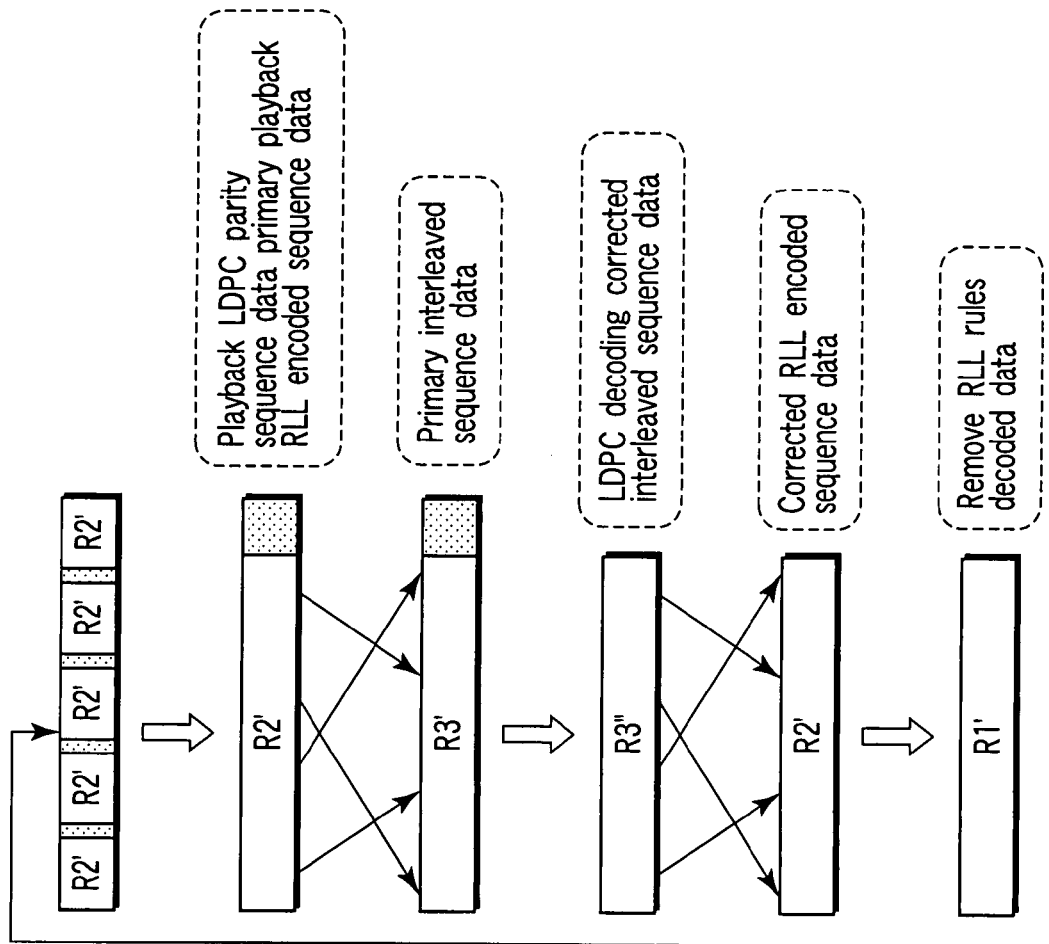
FIG. 2 is a flowchart of operation of the apparatus illustrated in FIG. 1.

Various embodiments according to the invention will be described hereinafter with reference to the accompanying drawings.

FIG. 1 illustrates an example of a basic structure of an apparatus according to the present invention. An example of recording information on a recording medium 100 is explained below.

The following example shows an RLL rule applying section 11 as a modulation rule applying section which modulates user data into a data code sequence comprising logic 1 and logic 0 and obtains modulation-rule-applied encoded sequence data. As described above, the RLL rule applying section 11 is used, if the modulation rule applying section processes user data by applying Run Length Limited (RLL) rules to the user data, and obtain RLL encoded sequence data as modulation-rule-applied sequence data. However, an MTR rule applying section (not shown) is used, if the modulation rule applying section processes user data by applying Maximum Run Transition (MTR) rules to the user data, and obtains MTR encoded sequence data as modulation-rule-applied encoded sequence data. Further, if another modulation method according to other recording and playback system is used, a modulation rule applying section according to the modulation method is used.

The former example adopting the RLL rule applying section 11 is explained below. User data is input to the RLL rule applying section 11, and processed based on RLL rules. The RLL encoded sequence data output from the RLL rule applying section 11 is supplied to an interleave section 12, and also supplied to one of the input terminals of an inserting section 14.

The interleave section 12 performs interleave processing for RLL encoded sequence data in batches of certain byte length (for example, 32 bytes). The interleaved system data output from the interleave section 12 is input to an LDPC parity generating section 13. A method of interleaving used in this step includes both of random interleave and uniform interleave (a method according to certain rules).

The LDPC parity generating section 13 performs low density parity check encoding, and obtains LDPC parity sequence data. The RLL rule of the LDPC parity data obtained therein is damaged. Therefore, the encoded data itself cannot be used as recording data without any processing.

The LDPC parity sequence data is supplied to the other input terminal of the inserting section 14. The inserting section 14 uses only parity of the data. Further, the RLL encoded sequence data input from the RLL rule applying section 11 is used as the main data. Therefore, the inserting section 14 inserts the parity from the LDPC parity generating section 13 in the RLL encoded sequence data in a distribution manner. The rule of the distribution is predetermined. For example, the parity is separated into parts of 2 bits, and inserted to every several words of the RLL encoded sequence data. The insertion bits are inserted to partly-expanded regions to avoid damage to the RLL rules.

The data obtained by the above method is output through the output section 15, and recorded on the recording medium 100. When the data is played back, the following processing is performed. The obtained data may be further subjected to ECC processing before recording.

The data read from the recording medium 100 is input to an extracting section 21, and separated into the user data and the parity. The user data is the above RLL encoded sequence data, and referred to as "playback RLL encoded sequence data". In a front stage of the extracting section 21 of FIG. 1, PRML processing using a soft determination output Viterbi decoder is performed, and an input of the extracting section 21 is not a hard value such as "0" and "1", but a soft value representing the likelihood that the value is "0" or "1".

The reproduction RLL encoded sequence data from the extracting section 21 is input to an interleave section 22, and interleaved therein. The interleave processing performed therein is the same as the interleave processing which the interleave section 12 performs for the output of the RLL rule applying section 11.

The output of the interleave section 22 is referred to as "primary interleaved sequence data". The primary interleaved sequence data is input to an LDPC decoding section 23, and processed together with the parity. Specifically, the primary interleaved sequence data is decoded, and outputted as corrected interleaved sequence data.

The corrected interleaved sequence data is input to a deinterleave section 24, and deinterleaved therein. The processing result of the deinterleave section 24 is input as corrected RLL encoded sequence data to a modulation rule removing section, that is, an RLL rule removing section 25 in this example, and then the RLL rules being the modulation rules are removed therein. Thereby, decoded data is obtained.

As described above, according to this apparatus, RLL encoded sequence data is recorded on a recording medium and played back from the recording medium, with the RLL rules maintained. Further, LDPC decoding processing is performed for the RLL encoded sequence data played back. Consequently, it is possible to perform LDPC encoding and decoding having a high correction ability not only for random errors but also for burst errors.

In the above example, output data of the output section 15 is recorded on the recording medium 100. However, the present invention is not limited to this structure, but the output data may be output to a transmission system.

FIG. 2 is a flowchart illustrating operation of the above apparatus with changes of data. Writing data items are provided with reference symbol W, and reproducing data items are provided with reference symbol R. User data W1 is converted into RLL encoded sequence data W2. The RLL encoded sequence data W2 is converted into interleaved sequence data W3. Further, the interleaved sequence data W3 is subjected to LDPC encoding, and thereby LDPC parity sequence data is obtained.

Parity of the LDPC parity sequence data is divided into a plurality of parts, and distributed in the RLL encoded sequence data.

Reproducing data items are explained below. Mixed RLL encoded sequence data, in which the parity of the LDPC parity sequence data is divided and distributed, is divided into the parity and the RLL encoded sequence data. The divided data items are referred to as "playback LDPC parity" and "primary playback RLL encoded sequence data". Next, the primary playback RLL encoded sequence data R2' is interleaved and changed into primary interleaved sequence data.

The interleave is performed in the same manner as the interleave processing performed in the write system. Since the interleaved sequence data has been subjected to LDPC encoding in the write system, LDPC decoding is performed for the primary interleaved sequence data by using the reproduced LDPC parity. The decoded data is referred to as "corrected interleaved sequence data R3'''".

The corrected interleaved sequence data R3" is subjected to deinterleave processing, and thereby corrected RLL encoded sequence data R2' is obtained. The corrected RLL encoding sequence data R2 corresponds to the RLL encoded sequence data W2. Therefore, the user data is decoded by removing the RLL rules from the corrected RLL encoded sequence data R2'.

In the meantime, in a method such as PRML method in which signal processing is performed by purposely using interference of waveforms, continuous errors having correlation between bits may occur after maximum likelihood decoding. Such continuous errors are disadvantageous to the LDPC decoder which performs decoding thereafter. However, since the interleave processing is adopted as described above, the performance of the LDPC encoding and decoding is fully exhibited.

The following is brief explanation of PRML technique. PRML technique has been adopted in recent years to improve the recording density. Partial Response (PR) is a method of playing back data with a narrower necessary signal band, by purposely using interference between codes (interference between playback signals corresponding to adjacent recorded bits). The method can be further classified into a plurality of classes according to method of generating interference between codes. For example, in the case of class 1, recorded data "1" is played back as 2-bit data "11", and interference between codes is generated for the following 1 bit. Further, the Viterbi decoding method (ML) is a kind of maximum likelihood sequence estimation method in which data is played back based on information of signal amplitudes of a plurality of times, by effectively using rules of interference between codes of playback waveforms. For this processing, a synchronizing clock is generated in synchronization with a playback waveform obtained from the recording medium, and the playback waveform is sampled and converted into amplitude information by using the clock. Thereafter, the amplitude information is converted into a response waveform of partial response by performing proper waveform equalizing. Then, the Viterbi decoding section outputs a most likely data sequence as playback data, by using past sample data and present sample data. A method obtained by combining the above Partial Response method with the Viterbi decoding method (maximum likelihood decoding) is called PRML method.

Next, a run length limited code used in PRML is explained. A PRML playback circuit generates a clock synchronous with a signal played back from a recording medium, from the signal itself. To generate a stable clock, it is necessary that the polarity of the recorded signal is inverted within a predetermined time. Simultaneously, it is necessary to prevent the polarity of the recorded signal from being inverted during a predetermined time, to reduce the maximum frequency of the recorded signal. The maximum data length in which the polarity of the recorded signal is not inverted is referred to as the "maximum run length", and the minimum data length in which the polarity is not inverted is referred to as "minimum run length". The modulation rule having the maximum run length being 7 bits and the minimum run length being 1 bit is called (1, 7) RLL, and the modulation rule having the maximum run length being 7 bits and the minimum run length being 2 bits is called (2, 7) RLL.

FIG. 3 illustrates an example of an information recording and playback apparatus to which the present invention is applied. Although FIG. 3 illustrates an apparatus which can deal with both a hard disk and an optical disk such as DVDs as a recording medium, the hard disk or optical disk such as DVDs may be replaced by a recording medium such as semiconductor memories.

The information recording and playback apparatus is equipped with, for example, a satellite broadcast tuner 111, a terrestrial digital broadcast tuner 112, and a terrestrial analog broadcast tuner 113, and can receive various broadcast signals. The information recording and playback apparatus also has an external input section 114. A recording signal processing section 115 selects a signal from the tuners and the external input section 114, and inputs the signal as a recording signal to an encoder 121.

The encoder 121 converts the recording signal to a predetermined format by using a buffer memory 122, and transmits the converted signal to a recording and playback processing section 142. The predetermined format is, for example, a format based on Digital Versatile Disk (DVD) standards. Examples of the format are DVD Video format, formats compliant with DVD-recording standards (such as DVD-VR format, DVD-R format, and DVD-RW format), and recording High-Density or High-Definition DVD (HD DVD) format.

A packet elementary stream extracted from a transport stream may be directly supplied from the encoder 121 to the recording and playback processing section 142.

The recording and playback processing section 142 performs addition of an error correction code, and RLL modulation processing. Specifically, the steps explained with reference to FIGS. 1 and 2 are performed. The output of the recording and playback processing section 142 is input to a hard disk driver 144 or an optical disk driver 145. It is selected according to a command from a control section 151 to which of the disk drivers 144 and 146 the modulation signal is input. The disk drivers 144 and 146 have respective rotation control systems, laser drive systems, and optical systems for the hard disk 145 and the optical disk 147, respectively.

Suppose that the hard disk 145 is selected as recording medium. A modulation signal is input to the hard disk driver 144, and recorded on the hard disk 145. Conversely, supposing that the optical disk 147 is selected as recording medium, a modulation signal is input to the optical disk driver 146, and recorded on the optical disk 147. A signal read from the hard disk 145 by the hard disk driver 144 is subjected to demodulation and error correction by an RLL and LDPC processing section 14A of the recording and playback processing section 142. Specifically, the processing explained with reference to FIGS. 1 and 2 is performed. In the same manner, a signal read from the optical disk 147 by the optical disk driver 146 is subjected to demodulation and error correction by the RLL and LDPC processing section 14A of the recording and playback processing section 142. Specifically, the processing explained with reference to FIGS. 1 and 2 is performed.

A decoding content obtained from the recording and playback processing section 142 is subjected to decoding by a decoder 131. In this example, content of DVD format is divided into packets, and divided into an audio stream and a video stream.

The audio stream is subjected to decoding according to the PCM method or MPG method, input to a digital-to-analog converter 133 through an audio selector 132, and converted into an analog signal. The analog audio signal is output as an audio signal by a speaker 134.

The video stream is subjected to decoding according to the MPEG 2 method or the like, and input to a video mixing section 135. The output of the video mixing section 135 is converted into a video signal by a digital-to-analog converter 136, and the video signal is input to a display 137. The video mixing section 135 can superimpose display data (also referred to as "on-screen display data") such as characters and figures from the control section 151 on the main image data.

The control section 151 includes a microcomputer, and controls each block of the recording apparatus. The control section 151 is connected with a display section 152 which displays the operation mode or the like. Further, the control section 151 inputs operation signals such as recording, playback, deletion, tuning, and channel selection from an operation signal input section (including a remote controller) 153.

Further, the control section 151 performs edits such as deletion of part of video objects of programs recorded on the hard disk 145 or the optical disk 147, and connection of objects of different programs.

Further, the control section 151 can connect the apparatus to an external network through a network interface (not shown). Thereby, the control section 151 can capture a dynamic electronic program guide (DEPG) from an external server.

Furthermore, the control section 151 executes detection of a defective part, detection of unrecorded areas, setting of recording information recording position, UDF recording, and setting of AV address, by using a RAM as work area, in accordance with a control program stored in a ROM thereof. The control section has various information processing sections necessary for performing centralized control of each block of the apparatus, and has a work RAM, a directory detecting section, a VMG (whole video management information) information generating section, a packet header processing section, and a sequence header processing section, etc. The control section 151 also has a management information control section for performing recording, and a management information control section for performing edits.

The control section 151 also has an EPG information processing section (program guide information processing section having a program guide information table) 151a, and a tuning processing control section 151b which control the tuners and the like. Further, as basic control means, the control section 151 includes a recording processing control section 151c, and a reproduction processing control section 151d. The control section 151 also includes a display processing control section 151h. The display processing control section 151h outputs a screen image serving as graphic user interface, in response to operation of the user.

According to the above embodiments, there is provided encoding and decoding apparatuses and encoding and decoding methods which enable use of interleave in combination with LDPC encoding and decoding method, making the full use of advantage of LDPC encoding and decoding method, without damaging the form of data processed by RLL rules.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An encoding apparatus comprising:
    a modulation rule applying section modulating user data into a data code sequence formed of logic 1 and logic 0 according to a predetermined rule, and obtaining modulation-rule-applied encoded sequence data;
    an interleave section interleaving the modulation-rule-applied encoded sequence data, and obtaining interleaved sequence data;
    an LDPC parity generating section subjecting the interleaved sequence data to low density parity check (LDPC) encoding processing, and obtaining LDPC parity sequence data;
    an inserting section configured to receive the modulation-rule-applied encoded sequence data and the LDPC parity sequence data, and insert species of the LDPC parity sequence data in the modulation-rule-applied encoded sequence data in a predetermined distributed manner, and obtaining output data; and
    an output section transmitting the output data.

2. The encoding apparatus according to claim 1, wherein the output section transmits the output data as data to be recorded on a recording medium.

3. The encoding apparatus according to claim 1, wherein the modulation rule applying section is an RLL rule applying section which processes the user data by applying a run length limited (RLL) rule to the user data, and thereby obtains RLL encoding sequence data as the modulation-rule-applied encoded sequence data.

4. The encoding apparatus according to claim 1, wherein the modulation rule applying section is an MTR rule applying section which processes the user data by applying maximum transition a run (MTR) rule to the user data, and thereby obtains MTR encoding sequence data as the modulation-rule-applied encoded sequence data.

5. A decoding apparatus comprising:
    an extracting section receiving input data, wherein such input data comprises data obtained by distributing parity of low density parity check (LDPC) parity sequence data in modulation-rule-applied encoded sequence data, wherein such modulation-rule-applied encoded sequence data comprises data obtained by modulating user data into a data code sequence formed of logic 1 and logic 0 according to a predetermined rule, and performing separation and extraction of the modulation-rule-applied encoded sequence data and the parity;
    an interleave section interleaving the extracted modulation-rule-applied encoded sequence data, and thereby obtaining primary interleaved sequence data;
    an LDPC decoding section performing LDPC decoding processing by using the primary interleaved sequence data and the parity, and obtaining corrected interleaved sequence data;
    a deinterleave section deinterleaving the corrected interleaved sequence data, and obtaining corrected modulation-rule-applied encoded sequence data; and
    a modulation rule removing section processing the corrected modulation-rule-applied encoded sequence data and thereby removing the modulation rule thereof.

6. The decoding apparatus according to claim 5, wherein the extraction includes receiving data read from a recording medium as the input data.

7. The decoding apparatus according to claim 5, wherein the modulation-rule-applied encoded sequence data is RLL encoded sequence data to which a run length limited (RLL) rule is applied.

8. The decoding apparatus according to claim 5, wherein the modulation-rule-applied encoded sequence data is MTR encoded sequence data to which a maximum transition run (MTR) rule is applied.

9. An information recording and playback apparatus comprising:
a modulation rule applying section modulating user data into a data code sequence formed of logic 1 and logic 0 according to a predetermined rule, and obtaining modulation-rule-applied encoded sequence data;
a first interleave section interleaving the modulation-rule-applied encoded sequence data, and obtaining interleaved sequence data;
an LDPC parity generating section subjecting the interleaved sequence data to low density parity check (LDPC) encoding processing, and obtaining LDPC parity sequence data;
an inserting section configured to receive the modulation-rule-applied encoded sequence data and the LDPC parity sequence data, and insert species of the LDPC parity sequence data in the modulation-rule-applied encoded sequence data in a predetermined distributed manner, and obtaining output data;
an output section transmitting the output data for recording on a recording medium;
an extracting section receiving input data, which is played back from the recording medium and in which parity of the low density parity check (LDPC) parity sequence data is distributed in the modulation-rule-applied encoded sequence data, and performing separation and extraction of the modulation-rule-applied encoded sequence data and the parity;
a second interleave section interleaving the extracted modulation-rule-applied encoded sequence data, and obtaining primary interleaved sequence data;
an LDPC decoding section performing LDPC decoding processing by using the primary interleaved sequence data and the parity, and obtaining corrected interleaved sequence data;
a deinterleave section deinterleaving the corrected interleaved sequence data, and obtaining corrected modulation-rule-applied encoded sequence data; and
a modulation rule removing section processing the corrected modulation-rule-applied encoded sequence data and thereby removing the modulation rule thereof.

10. The information recording and playback apparatus according to claim 9, wherein
the modulation-rule-applied encoded sequence data is RLL encoded sequence data.

11. The information recording and playback apparatus according to claim 9, wherein
the modulation-rule-applied encoded sequence data is MTR encoded sequence data.

12. An encoding method comprising:
modulating user data in a modulation rule applying section into a data code sequence formed of logic 1 and logic 0 according to a predetermined rule, and thereby obtaining modulation-rule-applied encoded sequence data;
interleaving the modulation-rule-applied encoded sequence data in an interleave section, and thereby obtaining interleaved sequence data;
subjecting the interleaved sequence data to low density parity check (LDPC) encoding processing in an LDPC parity generating section, and thereby obtaining LDPC parity sequence data;
receiving the modulation-rule-applied encoded sequence data and the LDPC parity sequence data, and inserting species of the LDPC parity sequence data in the modulation-rule-applied encoded sequence data in a predetermined distributed manner in an inserting section, and thereby obtaining output data; and
transmitting the output data from an output section.

13. A decoding method comprising:
receiving input data, wherein such input data comprises data obtained by distributing parity of low density parity check (LDPC) parity sequence data in modulation-rule-applied encoded sequence data, in an extracting section, and performing separation and extraction of the modulation-rule-applied encoded sequence data and the parity;
interleaving the extracted modulation-rule-applied encoded sequence data in an interleave section, and thereby obtaining primary interleaved sequence data;
performing LDPC decoding processing in an LDPC decoding section by using the primary interleaved sequence data and the parity, and thereby obtaining corrected interleaved sequence data;
deinterleaving the corrected interleaved sequence data in a deinterleave section, and thereby obtaining corrected modulation-rule-applied encoded sequence data; and
processing the corrected modulation-rule-applied encoded sequence data in a modulation rule removing section, and thereby removing the modulation rule thereof.

* * * * *